(12) United States Patent
Ran et al.

(10) Patent No.: US 7,551,418 B2
(45) Date of Patent: Jun. 23, 2009

(54) DEVICE FOR PREVENTING INTERNAL COMBUSTION OF EQUIPMENT FROM SPREADING OUTWARDS

(75) Inventors: Haosi Ran, Shenzhen (CN); Jianlin Zhou, Shenzhen (CN); Sheng Jin, Shenzhen (CN); Songping Wang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 12/052,560

(22) Filed: Mar. 20, 2008

(65) Prior Publication Data

US 2008/0204960 A1 Aug. 28, 2008

Related U.S. Application Data

(63) Continuation of application No. PCT/CN2006/001348, filed on Jun. 15, 2006.

(30) Foreign Application Priority Data

Sep. 22, 2005 (CN) .................. 2005 1 0037533

(51) Int. Cl.
*H02H 5/00* (2006.01)
*H02H 5/04* (2006.01)
(52) U.S. Cl. .................. 361/103; 361/104; 361/106
(58) Field of Classification Search .................. 361/103, 361/104, 106
See application file for complete search history.

(56) References Cited

U.S. PATENT DOCUMENTS 4,163,269 A * 7/1979 Helwig et al. .................. 361/42
4,245,270 A * 1/1981 Busby .......................... 361/58
4,719,973 A 1/1988 Allen et al.
4,803,481 A * 2/1989 Mueller et al. ............... 370/468
4,896,199 A * 1/1990 Tsuzuki et al. ................ 257/49
5,436,614 A * 7/1995 Torikoshi et al. ............. 340/584
5,572,395 A * 11/1996 Rasums et al. ................. 361/58
5,818,884 A * 10/1998 Reymond .................... 375/354
6,897,774 B2* 5/2005 Costa et al. .................. 340/522
7,004,625 B2* 2/2006 Egidio ......................... 374/166
2005/0093618 A1* 5/2005 Kobayashi et al. ........... 327/538
2006/0071733 A1* 4/2006 Hsu ............................. 331/176

FOREIGN PATENT DOCUMENTS

| CN | 1560636 A | 1/2005 |
| CN | 2717085 Y | 8/2005 |
| JP | 1995-233981 A | 9/1995 |

* cited by examiner

*Primary Examiner*—Stephen W Jackson
*Assistant Examiner*—Zeev Kitov
(74) *Attorney, Agent, or Firm*—Leydig, Voit & Mayer, Ltd.

(57) ABSTRACT

Two devices for preventing internal combustion of equipment from spreading outwards includes a sampling circuit, a detecting and monitoring circuit, and a low-voltage datum power supply. The sampling circuit includes two thermal detectors. The detecting and monitoring circuit includes a first monitoring output end and a second monitoring output end. When two thermal detectors are both normal, the first monitoring output is inactive and the second monitoring output is inactive. When one of the thermal detectors is abnormal, the first monitoring output is inactive and the second monitoring output is active. When the two thermal detectors are both abnormal, the first monitoring output is active and the second monitoring output is active. The first monitoring output is configured to turn off the power supply of a fan and the second monitoring output is configured to drive an alarm unit.

19 Claims, 3 Drawing Sheets

DEVICE FOR PREVENTING INTERNAL COMBUSTION OF EQUIPMENT FROM SPREADING OUTWARDS

CROSS-REFERENCE TO RELATED APPLICATIONS

This application is a continuation of International Patent Application No. PCT/CN2006/001348, filed Jun. 15, 2006, which claims priority to Chinese Patent Application No. 200510037533.8, filed on Sep. 22, 2005, entitled "Device for Preventing Internal Combustion of Equipment from Spreading Outwards," commonly assigned, both of which are incorporated by reference herein for all purposes.

FIELD OF THE INVENTION

The present invention relates to the technical field of overheat protection, and in particular to a device for preventing internal combustion of equipment from spreading outwards.

BACKGROUND OF THE INVENTION

When internal combustion of an equipment is caused by internal short circuits or other reasons, effective measures need to be taken to prevent flames from spreading to the outside of the equipment so as to avoid unnecessary risks. Conventional practice is to connect a thermal fuse in a power supply circuit of a cooling fan of the equipment in series. While internal combustion of the equipment is happening, internal temperature is high enough to melt the thermal fuse so as to turn off the cooling fan. One effect is to prevent air convection caused by continuous work of the fan, reduce supply of internal oxygen and make the combustion not continue any loner. Another effect is to prevent the fan from blowing flames out of the equipment and causing objects around to be burnt.

As shown in FIG. 1, which is a diagram illustrating a regularly adopted solution for overheat protection circuit in the prior art, the working mechanism is to connect a thermal fuse into the power supply circuit of a monitored unit in series. Thermal fuses F1, F2 are melted to cut off the power supply of the monitored unit when the temperature is high enough to avoid the harms caused by overheat. The aim of using the parallel connection design of the thermal fuses F1, F2 is to prevent mis-operation caused by failure of one of the thermal fuses. The thermal fuses are made into a small module and installed on a structure supporting frame of equipment via wires. The monitored unit shown in the figure is a fan.

In the solution of the prior art, due to lack of any automatic detecting measure to report the failure of the thermal fuse and reminding a maintainer for timely replacement when one of the thermal fuses fails due to other reasons (for example, fails during production welding), a fan may be turned off incorrectly if other thermal fuses also fail because of other reasons except over temperature (for example, a failure of aging). This may result in a quite high internal temperature without cooling by the fan and cause damage to the equipment. Furthermore, a service may be abnormal or even collapse. Therefore, the solution shown in FIG. 1 has poor maintainability and testability. In addition, the thermal fuse monitors the power supply of the fan which is strong power. The thermal fuse module is regularly installed on the structure support of the equipment and the support is connected to a protection ground (PGND) of the equipment. Therefore, there are safety specification requirements on the wires of the power supply and the PGND of the support. At the same time, shell and pins of some thermal fuses are equipotential. In other words, the housing and the power supply are also equipotential when the pins of the thermal fuse are connected to the power supply. Therefore, there are safety specification requirements on the shell of the thermal fuses and the PGND of the structure element of the equipment. A short circuit between the PGND and the power supply may be easily caused in the case of improper processing.

SUMMARY OF THE INVENTION

The present invention provides two devices for preventing internal combustion of equipment from spreading outwards. The device is not only provided with function of alarm and monitoring the power supply, but also may avoid the safety specs problem.

Technical solutions of the present invention include:

a device for preventing internal combustion of equipment from spreading outwards including a sampling circuit, a detecting and monitoring circuit connected to the sampling circuit and a low-voltage datum power supply; the output of the low-voltage datum power supply is connected to the ground via the sampling circuit to form a loop circuit;

the sampling circuit includes at least two thermal detectors, the detecting and monitoring circuit includes a first monitoring output end out1 and a second monitoring output end out2, and the detecting and monitoring circuit monitors the output of the first monitoring output end out1 and the second monitoring output end out2 according to the status of the thermal detectors as follows:

the first monitoring output Vout1 is inactive and the second monitoring output Vout2 is inactive when the at least two thermal detectors are in normal state;

the first monitoring output Vout1 is inactive and the second monitoring output Vout2 is active when some of the at least two thermal detectors are in abnormal state;

the first monitoring output Vout1 is active and the second monitoring output Vout2 is active when the at least two thermal detectors are all in abnormal state;

the first monitoring output Vout1 is configured to turn off a power supply, and the second monitoring output Vout2 is configured to drive an alarm unit.

One preferable embodiment of the present invention is that:

the sampling circuit includes a first thermal detector F1, a second thermal detector F2, a first resistor R1, a second resistor R2, a third resistor R3 and a fourth resistor R4;

the first thermal detector F1 and the first resistor R1 are connected in series to form a first branch circuit, the second thermal detector F2 and the fourth resistor R4 are connected in series to form a second branch circuit, the first branch circuit and the second branch circuit are connected in parallel to form a thermal detector parallel circuit;

the thermal detector parallel circuit and the second resistor R2 and the third resistor R3 are connected in series and between the low-voltage datum power supply and the ground.

The detecting and monitoring circuit includes a first input end in1 and a second input end in2.

The first input end in1 of the detecting and monitoring circuit is connected between the thermal detector parallel circuit and the second resistor R2, the second input end in2 is connected between the second resistor R2 and the third resistor R3.

The detecting and monitoring circuit is realized by an integrated voltage comparator or a discrete voltage comparator.

Another exemplary embodiment of the present invention is that:

the sampling circuit includes a first thermal detector F1, a second thermal detector F2, a first resistor R1, a fifth resistor R2' and a fourth resistors R4;

the first thermal detector F1 and the first resistor R1 are connected in series to form a first branch circuit; the second thermal detector F2 and the fourth resistor R4 are connected in series to form a second branch circuit; the first branch circuit and the second branch circuit are connected in parallel to form a thermal detector parallel circuit;

the thermal detector parallel circuit and the fifth resistor R2' are connected in series and between the low-voltage datum power supply and the ground.

The detecting and monitoring circuit includes an analog-to-digital AD converting chip and a CPU coupled with the AD converting chip;

an input end in1 of the AD converting chip is connected between the thermal detector parallel circuit of the sampling circuit and the fifth resistor R2'; one output pin on the CPU is a first monitoring output end; another output pin on the CPU is a second monitoring output end.

The thermal detector in the sampling circuit is installed on a thermal detecting single-board. The thermal detecting single-board is installed in equipment in a manner of hot plug.

The device further includes a pull-up resistor configured to pull a mode selection signal in the detecting and monitoring circuit up to the status of power supply VCC so as to make the first monitoring output Vout1 inactive and the second monitoring output Vout2 active when the thermal detecting single-board is off-duty.

The device further includes a delay driving circuit connected after the first monitoring output end in series and configured to eliminate the status of dithering occurred during the hot plug of the thermal detecting single-board.

The thermal detector is an element whose on-off changes with the change of temperature, or an element whose resistance value changes greatly with the change of temperature.

The power supply includes but not limited to a power supply of a fan or a power supply of a system and a fan.

A device for preventing internal combustion of equipment from spreading outwards includes at least two sampling circuits, a detecting and monitoring circuit and a low-voltage datum power supply which are connected to each of the sampling circuits respectively. An output of the low-voltage datum power supply is connected to the ground via each of the sampling circuits respectively to form a loop circuit with each of the sampling circuits independently. Each of the sampling circuits includes at least two thermal detectors. The detecting and monitoring circuit includes a first monitoring output end out1 and a second monitoring output end out2. The detecting and monitoring circuit monitors the output of the first monitoring output end out1 and the second monitoring output end out2 according to the working status of the thermal detector in each of the sampling circuits as follows:

the first monitoring output Vout1 is inactive and the second monitoring output Vout2 is inactive when the thermal detectors in the device are all in normal status;

the first monitoring output Vout1 is inactive and the second monitoring output Vout2 is active when some of the thermal detectors in the device is in abnormal status and at least one thermal detector in each of the sampling circuits is normal;

the first monitoring output Vout1 is active and the second monitoring output Vout2 is active when all the thermal detectors in at least one sampling circuit are in abnormal status.

The first monitoring output Vout1 is configured to cut off the power supply of a fan, and the second monitoring output Vout2 is configured to drive an alarm unit.

One preferable embodiment of the present invention is that:

The sampling circuit includes a first thermal detector F1, a second thermal detector F2, a first resistor R1, a fifth resistor R2' and a fourth resistors R4.

The first thermal detector F1 and the first resistor R1 are connected in series to form a first branch circuit. The second thermal detector F2 and the fourth resistor R4 are connected in series to form a second branch circuit. The first branch circuit and the second branch circuit are connected in parallel to form a thermal detector parallel circuit. The thermal detector parallel circuit and the fifth resistor R2' are connected in series and between the low-voltage datum power supply and the ground.

The detecting and monitoring circuit includes an analog-to-digital AD converting chip and a CPU coupled with the AD converting chip.

Each input end in1 of the AD converting chip is connected between the thermal detector parallel circuit of each of the sampling circuits and the fifth resistor R2' respectively, one output pin on the CPU is a first monitoring output end, another output pin on the CPU is a second monitoring output end.

The thermal detector parallel circuit is installed on a thermal detecting single-board. The thermal detecting single-board is installed in the device in a manner of hot plug.

The present invention further includes a pull-up resistor configured to pull a mode selection signal in the detecting and monitoring circuit up to the status of power supply VCC so as to make the first monitoring output Vout1 inactive and the second monitoring output Vout2 active when the thermal detecting single-board is off-duty.

The device further includes a delay driving circuit connected after the first monitoring output end in series and configured to eliminate the status of dithering occurred during the hot plug of the thermal detecting single-board.

The thermal detector is an element whose on-off changes with the change of temperature, or an element whose resistance value changes greatly with the change of temperature.

The power supply includes, but not limited to, a power supply of a fan or a power supply of a system and a fan.

With the present invention, an alarm may be reported effectively when one thermal detector on the thermal detecting single-board is abnormal. The fan of the system may not stop working because of the abnormal single-board. The maintenance may be taken timely. An alarm is reported and the power supply of the fan or the power supply of the system and the fan may be turned off when all the thermal detectors on the thermal detecting single-board are abnormal so as to prevent the internal combustion of equipment from spreading outwards and report alarm information in time for timely maintenance. Moreover, during the process of maintenance, the replacement of the thermal detecting single-board does not affect the normal work of the system so as to ensure the reliable running of the system. Safety specs problems may not be caused when a short circuit emerges between the thermal detecting single-board and the shell of the system, and elements may not be burnt out due to the short circuit.

DETAILED DESCRIPTION OF THE EMBODIMENTS

The realization idea of the present invention is to connect a thermal detector into a low voltage power supply loop circuit in series so as to avoid the safety specs problem existing in strong power wires caused by connecting the thermal detector directly to a power supply circuit of a monitored unit in series in the prior art; and achieve the aim of alarm and monitoring the power supply by a change of resistance value of the thermal detector. The thermal detector may be realized by an element whose on-off change may be caused due to the change of temperature, for example, a thermal fuse. Alternatively, the thermal detector may be realized by an element whose resistance value may greatly change caused due to the change of temperature, for example, a thermistor. Whichever element is used, the realizing principle is the same except a difference of resistance value of each voltage dividing resistor in a practical circuit. The present invention is illustrated as follows by a thermal fuse for example.

Figure 1:
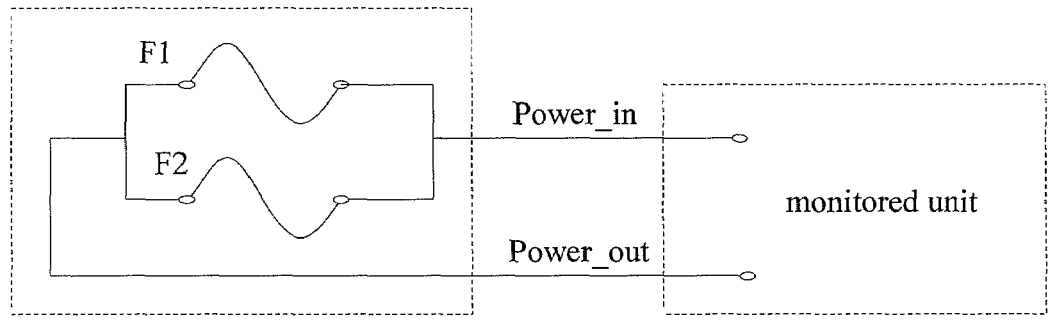
FIG. 1 is a schematic diagram illustrating a solution of the prior art.
Figure 2:
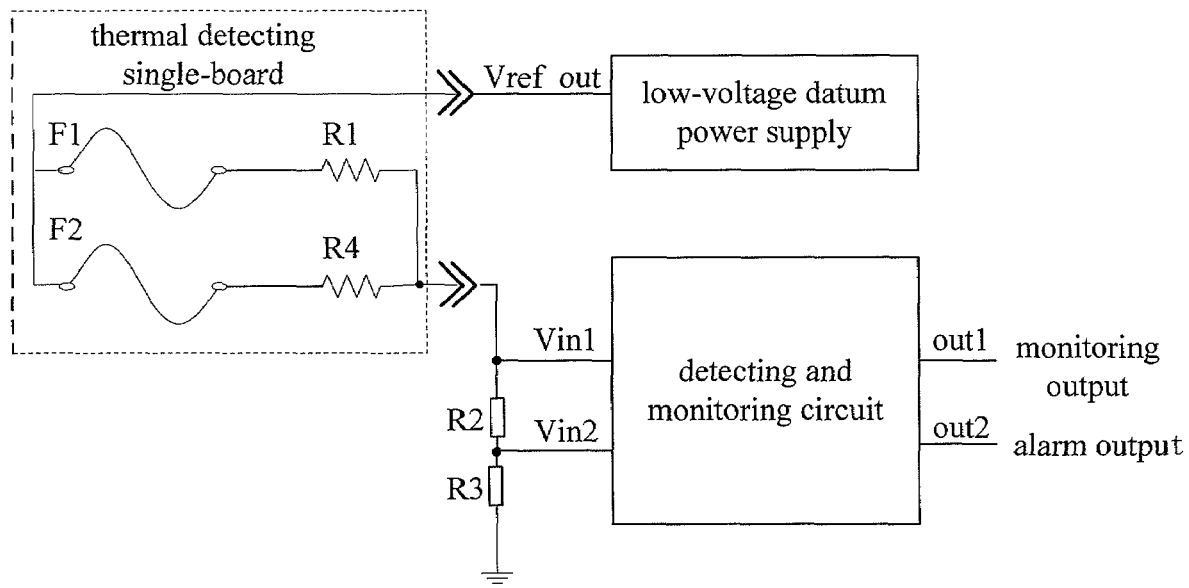
FIG. 2 is a schematic diagram illustrating a device for preventing internal combustion from spreading outwards according to a realizing manner of the present invention.
Figure 3:
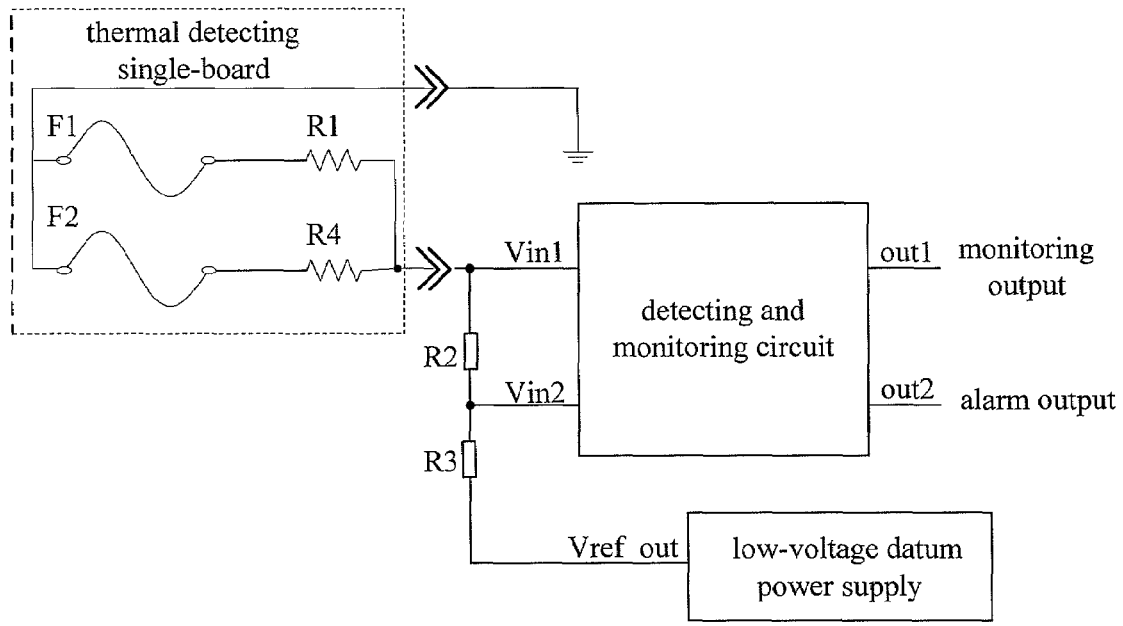
FIG. 3 is a schematic diagram illustrating a device for preventing internal combustion from spreading outwards according to another realizing manner of the present invention.

As shown in FIG. 2 and FIG. 3, in this realization solution, a thermal fuse is connected to a low voltage power supply loop circuit in series so as to avoid the safety specs problem existed in strong power wires caused by connecting the thermal detector directly to a power supply circuit of a monitored unit in series in the prior art. The design is as follows. A first thermal fuse F1 is connected to a first resistor R1 in series. A second thermal fuse F2 is connected to a fourth resistor R4 in series. Then they are connected in parallel to form a thermal fuse parallel circuit. The resistors R4 and R1 have the same resistance value, that is, R4=R1. Particularly, if F1 and F2 are thermal detectors, the thermal fuse parallel circuit here is a thermal detector parallel circuit.

The equivalent resistance of the parallel circuit is R1/2 when the thermal fuse is normal. The equivalent resistance of the parallel circuit is R1 when one thermal fuse is abnormal. The equivalent resistance of the parallel circuit is infinity when all thermal fuses are abnormal. This converts the failure situation of the thermal fuses into the equivalent resistance value change of the parallel circuit and further converts it into a voltage value change of Vin1 corresponding to a first monitoring output Vout1 and a voltage value change of Vin2 corresponding to a second monitoring output Vout2 by a low-voltage datum power supply, thermal fuses F1, F2 and voltage dividing resistors R1, R4, R2 and R3. The failure situation of the thermal fuses may be judged by detecting the voltage values of Vin1 and Vin2.

The working mechanism is as follows. A first low-voltage datum power supply outputs a low-voltage datum power supply Vref_out to form a loop circuit via the thermal fuses F1, F2, resistors R1, R4, R2, R3, to the ground. The thermal fuse parallel circuit is connected to the resistors R2, R3 orderly in series between the first low-voltage datum power supply and the ground. A first input end in1 of the monitoring and detecting circuit is connected between the thermal fuse parallel circuit and the second resistor R2. A second input end in2 is connected between the second resistor R2 and the third resistor R3. In FIG. 2 and FIG. 3, the thermal fuse parallel circuit is a circuit connected by F1, F2, R1, R4 (in which R1=R4) shown in a dashed line block diagram, and may be made into a small module named thermal detecting single-board and installed on the structure supporting frame via weak wires. The detecting and monitoring circuit has two monitoring output ends that a first monitoring output end out1 and a second monitoring output end out2. The first monitoring output Vout1 is used to turn off the power supply of the fan. The second monitoring output Vout2 is used to drive an alarm circuit.

1) When the thermal fuses F1, F2 are both normal, Vin1=(R2+R3)*Vref_out/ (R1/2+R2+R3), Vin2=R3*Vref_out/(R1/2+R2+R3). The first monitoring output Vout1 and the second monitoring output Vout2 of the detecting and monitoring circuit are inactive. There is no failure alarm and the fan works normally.

When one thermal fuse F1 or F2 fails, Vin1=(R2+R3)*Vref_out/(R1+R2+R3), Vin2=Vref_out*R3/(R1+R2+R3). The second monitoring output Vout2 of the detecting and monitoring circuit is active; and the first monitoring output Vout1 is inactive. There is a failure alarm of and the fan is working normally.

3) When the thermal fuses F1 and F2 are both abnormal, Vin1=0, Vin02=0. The first monitoring output Vout1 is active and the second monitoring output Vout2 is active. There is an alarm and the fan is turned off at the same time.

It should be pointed out that in FIG. 2 and FIG. 3, the thermal fuse parallel circuit, i.e. the thermal detecting single-board, is equivalent to a sampling circuit.

Figure 4:
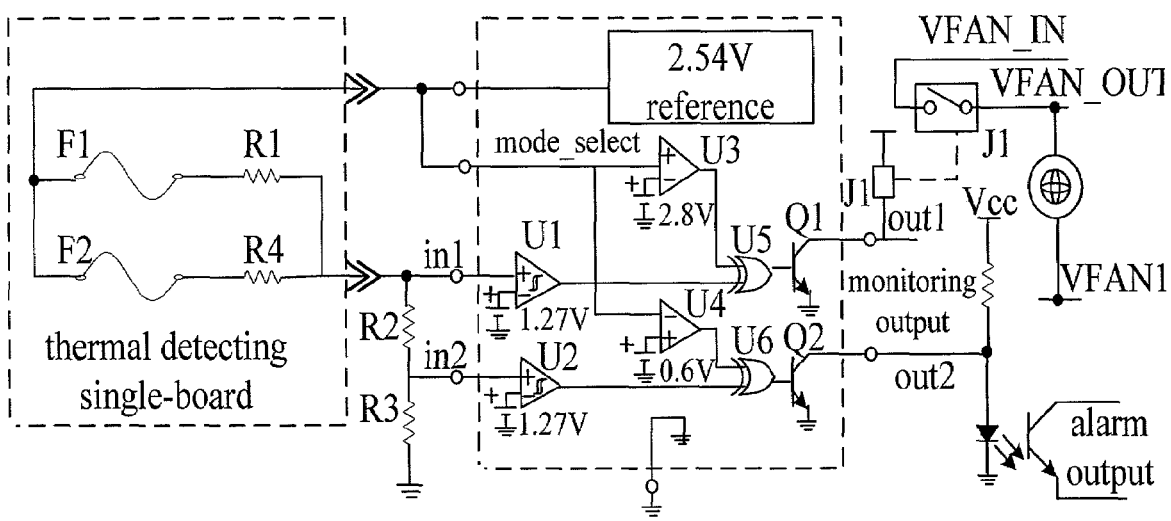
FIG. 4 is a schematic diagram illustrating a device for preventing internal combustion from spreading outwards according to an embodiment of the present invention.

Further details for the solution by a particular realization circuit are as follows:

As shown in FIG. 4, the detecting and monitoring circuit includes hysteresis comparators U1, U2; mode selection comparators U3, U4; XOR gate U5, U6 and transistors Q1 and Q2.

A positive input end of the first hysteresis comparator U1 is the first input end in1 of the detecting and monitoring circuit connected between the thermal fuse parallel circuit and the second resistor R2. A positive input of the second hysteresis comparator U2 is the second input in2 of the detecting and monitoring circuit connected between the second resistor R2 and the third resistor R3. The negative input ends of the first hysteresis comparator U1 and the second hysteresis comparator U2 are both connected to a second datum voltage power supply.

The negative input ends of the first mode selection comparator U3 and the second mode selection comparator U4 are connected to a first datum voltage power supply. The positive input end of the first mode selection comparator U3 is connected to a third datum voltage power supply. The positive input end of the second mode selection comparator U4 is connected to a fourth datum voltage power supply.

The output ends of the first hysteresis comparator U1 and the first model selection comparator U3 are connected to the input end of the first XOR gate U5. The output ends of the second hysteresis comparator U2 and the second model selection comparator U4 are connected to the input end of the second XOR gate U6.

The output end of the first XOR gate U5 and the second XOR gate U6 is connected to the base electrodes of the first transistor Q1 and the second transistor Q2 respectively. The emitters of the first transistor Q1 and the second transistor Q2 are connected to the ground, a emitter of the first transistor Q1 is connected to the first monitoring output Vout1, a emitter of the second transistor Q2 is connected to the second monitoring output Vout2;

In order to realize the technical solution of the present invention, the voltage of the third datum voltage power supply is higher than that of the first datum voltage power supply. The voltage of the fourth datum voltage power supply is lower than that of the first datum voltage power supply. The voltage of the second datum voltage power supply is lower than that of the first datum voltage power supply.

To descript conveniently and intuitively, the embodiment shown in FIG. 4 takes a group of voltages of the low-voltage datum power supply as examples. The voltage Vref_out of the first datum voltage power supply is 2.54V. The voltage of the second datum voltage power supply is 1.27V. The voltage of the third datum voltage power supply is 2.8V. The voltage of the fourth datum voltage power supply is 0.6V. Person in this art should understand that, in practical applications, the voltage of the low-voltage datum power supply may choose other values.

In FIG. 4, a truth table corresponding to the detecting and monitoring circuit is shown in Table 1 below. In the present embodiment, a mode selection signal (mode_select) is connected to a reference power supply 2.54V, which is in conformity with the logic in the dark block. Therefore, the output out1 and the input in1 are logically conformable but the output out2 and the input in2 are logically reversal. The truth table is not going to be described in detail in the present specification. The working process of the detecting and monitoring circuit is analyzed only based on the situation that the mode selection signal (mode_select) is connected to the reference power supply 2.54 V, namely the first datum voltage. The situation that the mode selection signal is connected to other datum voltages has the same analysis principle and won't be described any more.

TABLE 1

Truth Table of the Detecting and Monitoring Circuit

| Mode Selection Signal | in1 | out1 | in2 | out2 | Remark |
|---|---|---|---|---|---|
| GND | 0 | 0 | 0 | 0 | channel 1 and channel 2: no |
|  | 1 | 1 | 1 | 1 | reversing |
| Vref | 0 | 0 | 0 | 1 | channel1: no reversing |
|  | 1 | 1 | 1 | 0 | channel2: reversed |
| Vcc(>2.0 V) | 0 | 1 | 0 | 1 | channel 1 and channel 2: |
|  | 1 | 0 | 1 | 0 | reversed |

In Table 1, the channel means a logical relation of out relative to in, i.e. see also the dark block in Table 1, the channel 1 no reversing means out1 relative to in1 is not logically reversed. The channel 2 reversing means out2 relative to in2 is logically reversed.

As shown in FIG. 4, the positive end of the mode selection comparator U3 is connected to a reference voltage 2.8V. The positive end of the mode selection comparator U4 is connected to a reference voltage 0.6V. The comparative output result of U3 is "1" when the mode selection input signal (mode_select) is connected to a reference power supply 2.54 V. The comparative output result of U4 is "0". The output of U1 is "1" when in1 is higher than 1.27 V. By the XOR of the output "1" of U1 and the output "1" of U3, the output of U5 is "0" and the transistor Q1 is cut off. An external pull-up power supply VCC guarantees out1 to be "1". The output of U1 is "0" when in1 is less than 1.27V. By the XOR of the output "0" of U1 and the output "1" of U3, the output of U5 is "1" and the transistor Q1 is on-saturated. The output out1 is "0". U1 has a function of hysteresis which may prevent an uncertain status when in1 is equal to 1.27V. Similarly, the output of U2 is "1" when in2 is higher than 1.27V. By the XOR of the output "1" of U2 and the output "0" of U4, the output of U6 is "1" and the transistor Q2 is on-saturated. The output out2 is "0". The output of U2 is "0" when in2 is lower than 1.27V. By the XOR of the output "0" of U2 and the output "0" of U4, the output of U6 is "0" and the transistor Q2 is cut off. The external pull-up power supply VCC guarantees the out2 to be "1". U2 has a function of hysteresis which may prevent an uncertain status when in2 is equal to 1.27V.

As shown in FIG. 4, R1, R4, R2, R3 are sampling and voltage dividing resistors and R1=R4 and compared with a datum power supply 1.27V after sampling and voltage dividing.

1) When thermal fuses F1, F2 are both normal, Vin1=(R2+R3)*Vref/R1/2+R2+R3, Vin2=R3*Vref/(R1/2+R2+R3), R1, R2, R3 are assigned values properly to make Vin1>1.27V and Vin2>1.27V. According to Table 2 of the inputs and outputs relation table, the output of the first monitoring output Vout1 is logic "1" indicating that the monitoring is inactive. The follow-up monitored unit works normally. The output of the second monitoring output Vout2 is logic "0". A phototransistor is cut off and the alarm is inactive.

2) When thermal fuse F1 or F2 fails, Vin1=(R2+R3)*Vref/(R1+R2+R3), Vin2=R3*Vref/(R1+R2+R3), R1, R2, R3 are assigned values properly to make Vin1>1.27V and Vin2>1.27V, according to Table 2 of an inputs and outputs relation table, the output of the first monitoring output Vout1 is logic "1" indicating that the monitoring is inactive. The fan works normally. The output of the second monitoring output Vout2 is logic "1". The phototransistor is on and the alarm is active 3) When thermal fuses F1 and F2 both fail, in1=0, in2=0, so Vin1<1.27V, Vin2<1.27V. According to Table 2 of an inputs and outputs relation table, the output of the monitoring output Vout1 is logic "0" indicating that the monitoring is active. The fan is turned off. The output of Vout2 is logic "1". The phototransistor is on and the alarm is active.

TABLE 2

Inputs and Outputs Relation Table

| F1 | F2 | in1 | out1 | in2 | out2 |
|---|---|---|---|---|---|
| normal | normal | 1 | 1 (monitoring is inactive) | 1 | 0 (alarm is inactive) |
| failure (open) | normal | 1 | 1 (monitoring is inactive) | 0 | 1 (alarm is active) |
| normal | failure (open) | 1 | 1 (monitoring is inactive) | 0 | 1 (alarm is active) |
| failure (open) | failure (open) | 0 | 0 (monitoring is active) | 0 | 1 (alarm is active) |

Method for assigning the values of R1, R2, R3, for example, is as follows:

1) To guarantee the in1 to be 1 when F1 or F2 is fails, what should be satisfied is:

$$Vin2=(R2+R3)*2.54/(R1/2+R2+R3)>1.27V, (R2+R3)/(R1/2+R2+R3)>0.5$$

2) To guarantee the in2 to be 1 only when F1 and F2 are both normal, what should be satisfied is:

$Vin2=R3*2.54/(R1/2+R2+R3)>1.27V, R3/(R1/2+R2+R3)>0.5$

Therefore, the assigned values of R1, R2, R3 should satisfy the above two formulas at the same time, for example, R1=10 Kohm, R2=4.7 Kohm, R3=12 Kohm.

As shown in FIG. 4, in the process of normal implementation, the output of the first monitoring output Vout1 is high level when short circuit occurs in the thermal fuse F1 or F2 due to some reasons, for example aging. A relay J1 does not act. A normally closed switch monitored by the relay is closed. The fan is supplied with power by a power supply. The cooling of the system is normal. Vout2 is high level. A second monitoring output (alarm) is active. The system reports a failure alarm of the thermal detecting single-board. A maintainer may correctly judge the failure alarm of the thermal detecting single-board according to the reported alarm information and pull out the inactive thermal detecting single-board. The fan of the system stops rotating due to the complete disconnection of the thermal detecting single-board. Then a good thermal detecting single-board is plugged in. The output of first monitoring output Vout1 is high level. The relay J1 doesn't act. The normally closed switch monitored by the relay is closed. The fan is supplied with power by a power supply and resumes rotating. An alarm information reported by out2 for detecting a failure of the system disappears. Because the replacement for the thermal detecting single-board takes a short time, the fan stops for a short time. The temperature of the system during the process of replacement may not rise greatly. Therefore, the process of replacing the thermal detecting single-board may not affect the normal work of the system. The maintenance process has a better maneuverability and reliability.

The temperature at the air outlet rises sharply when the system is in fire and the thermal fuses F1, F2 are cut off rapidly because the thermal detecting single-board is installed at the air outlet of the system. The detecting and monitoring circuit outputs alarm information of the thermal detecting single-board and cuts off the power supply of the fan. The combustion of the system decreases the oxygen. The concentration of the carbon dioxide produced by the combustion increases so as to effectively prevent a further internal combustion. At the same time, the internal flame may not be blown out of the equipment by the fan. Therefore, the present technical solution may effectively prevent flames from spreading when combustion occurs.

The detecting circuit uses a weak datum power supply, as shown in table 3, the output of the datum power supply has an effect of limiting current, without using a strong power supply, for example, a power supply of the fan. A short circuit with the shell occurs in some part of the thermal detecting single-board when the thermal detecting single-board is operated improperly, an output of great current may not be caused. Therefore, patch plugs, PCB, wires and elements may not be burnt out due to the great current. The system may resume normal running when the failure of short circuit disappears because all the elements are not damaged.

TABLE 3

| | Reference Outputs | | | |
|---|---|---|---|---|
| voltage output ($I_0$ = 0 mA, $T_A$ = 25) | Vref | 2.48 | 2.54 | 2.60 V |
| load adjust ($I_0$ = 0 mA~2.0 mA) | $Reg_{load}$ | — | 0.6 | 15 mV |
| wire adjust (Vcc = 4.0 V~40 V) | $Reg_{line}$ | — | 5.0 | 15 mV |

TABLE 3-continued

| | Reference Outputs | | | |
|---|---|---|---|---|
| total output change (due to the influence of wires, load, and temperature) | $\Delta Vref$ | 2.45 | — | 2.60 V |
| short circuit current | Isc | — | 8.5 | 30 mA |

As another embodiment, the detecting and monitoring circuit in FIG. 2 may also be realized by a discrete voltage comparator.

Figure 5:
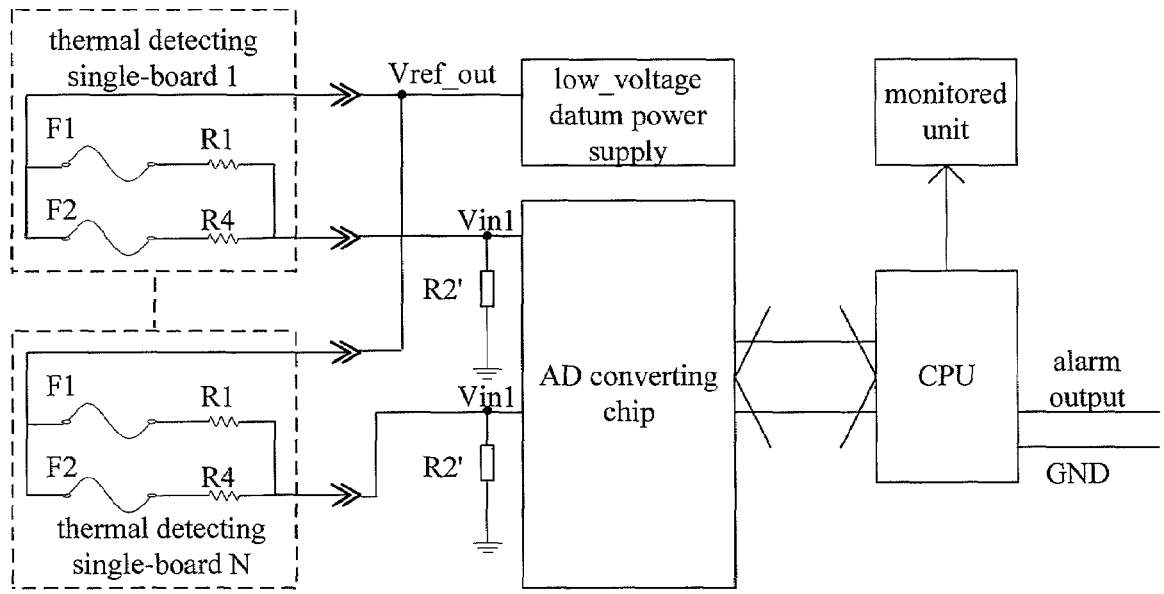
FIG. 5 is a schematic diagram illustrating a device for preventing internal combustion from spreading outwards according to another embodiment of the present invention.

FIG. 5 illustrates an embodiment which may monitor one or more thermal detecting single-boards by a method of AD converting for monitoring the power supply of the fan. In some large equipments, many overheat protection detecting circuits are needed to be installed in several places. In this case, situations of different detecting points may be sampled by an A/D converting chip. A CPU judges whether to report a failure alarm and whether to turn off the fan or the power supply according to the values sampled from different channels.

FIG. 5 includes several groups of sampling circuits, a detecting and monitoring circuit connected to the sampling circuits and a low-voltage datum power supply. The sampling circuit includes a first thermal fuse F1, a second thermal fuse F2, a first resistor R1, a fifth resistor R2' and a fourth resistor R4. The first thermal fuse F1 is connected to the first resistor R1 in series to form a first branch circuit. The second thermal fuse F2 is connected to the fourth resistor R4 in series to form a second branch circuit. The first branch circuit and the second branch circuit are connected in parallel to form a thermal fuse parallel circuit. The thermal fuse parallel circuit and the fifth resistor R2' are connected in series and connected between the first low-voltage datum power supply and the ground. The detecting and monitoring circuit includes an AD converting chip and a CPU coupled with the AD converting chip. Each input end in1 of the AD converting chip is connected between the thermal fuse parallel circuit of the sampling circuit and the fifth resistor R2' respectively. The CPU monitors the action of the monitored unit via output pins according to the working status of the thermal fuses in each sampling circuit. The monitored unit may include a fan, a power supply of a system, an alarm circuit and so on.

Figure 6:
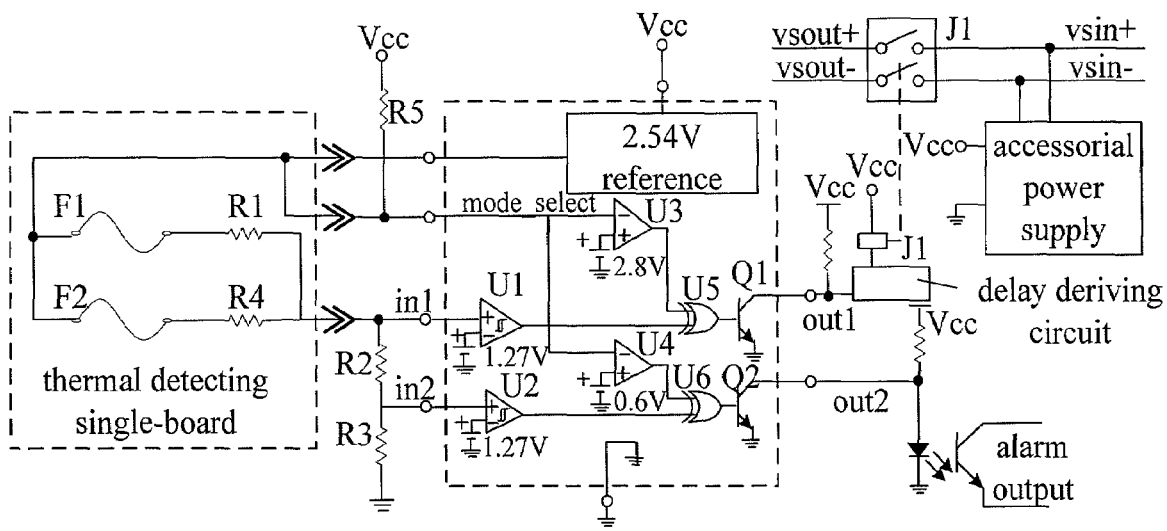
FIG. 6 is a schematic diagram illustrating a device for preventing internal combustion from spreading outwards according to another embodiment of the present invention.

FIG. 6 illustrates another embodiment of the present invention. In the embodiment, the detecting and monitoring circuit may monitor the on-off of the power supply of a system. Similar to the embodiment shown in FIG. 4, the voltage value of the datum voltage power supply is illustrative. The present invention is not limited to this concrete value. Other values may also be chosen in applications.

As illustrated in FIG. 6, the input level of the mode selection signal mode_select of the detecting and monitoring circuit is 2.54V when a thermal detecting single-board is used normally. The detecting principle and the monitoring method is the same as the monitoring manner shown in FIG. 4. When F1 and F2 on the thermal detecting single-board are normal, inputs of in1 and in2 are higher than 1.27V. The output of out1 is hanged. J1 doesn't act. The output of a power supply of a system is normally closed; out2 is low level, and an alarm output is inactive. When one thermal fuse on the thermal detecting single-board is abnormal due to aging, the input of in1 is higher than 1.27V, the output of out1 is hanged, J1 doesn't act, and the output of the power supply of the system is normally closed; the input of in2 is lower than 1.27V, the output of out2 is high level, the alarm output is active. The power supply relay J1 acts when two thermal fuses F1 and F2 are open at the same time. The whole system (including the power supply of the fan) is power-down, which makes the fan of the equipment stop running and cuts off the thermal source caused by the power supply, a combustion spreading is prevented effectively.

In this embodiment, the mode selection signal mode_select of the detecting and monitoring circuit is pulled up to the status of VCC by a sixth resistor R5 when the thermal detecting single-board is off-duty. The inputs of in1 and in2 are low level. According to the truth table illustrated in Table 4 (shown in the dark block), the first monitoring output Vout1 is in the state of 1. The power supply relay J1 keeps in the normally closed state. The system keeps an output of power supply. The second monitoring output Vout2 is in the status of 1 because the thermal detecting single-board is off-duty, and an alarm output reported by an alarm circuit is active.

TABLE 4

| mode selection signal | in1 | out1 | in2 | out2 | comments |
|---|---|---|---|---|---|
| GND | 0 | 0 | 0 | 0 | channel 1 and channel 2: |
|  | 1 | 1 | 1 | 1 | no reversing |
| Vref | 0 | 0 | 0 | 1 | channel 1: no reversing |
|  | 1 | 1 | 1 | 0 | channel 2: reversed |
| Vcc(>2.0 V) | 0 | 1 | 0 | 1 | channel 1 and channel 2: |
|  | 1 | 0 | 1 | 0 | reversed |

The maintainer may judge an alarm of the failure of the thermal detecting single-board correctly by the reported alarm information when one thermal fuse on the thermal detecting single-board fails due to some reasons, for example, aging, and pull out the disabled thermal detecting single-board. The thermal detecting single-board is completely cut off. The thermal detecting single-board is off-duty. The system keeps an output of power supply. The output of the first monitoring output Vout1 is that the monitoring is inactive when a good thermal detecting single-board is plugged in and detected by the system via the detecting and monitoring circuit. The power supply keeps an output. An alarm information reported by a second monitoring output out2 for detecting a failure of the system disappears. In addition, the thermal detecting single-board may only be provided with thermal fuses F1 and F2. The resistors R1 and R4 are fixed and connected in the circuit. In all the above embodiments, a sampling circuit including two thermal fuses F1 and F2 is taken as an example. In practical application, the number of the thermal fuses may be more than two.

In addition, the design of connecting a delay driving circuit in series between the first monitoring output end out1 and the power supply relay J1 is adapted for eliminating the influence of possible dithering in an uncertain status emerging during a process of plugging and pulling a board, i.e. hot plug so that a power-down may not occur in a system during the normal using and maintaining, which guarantees a maintainability and liability of the using of the system.

The above-mentioned thermal fuse includes an electronic element whose on-off changes with the change of temperature, for example, a thermal fuse and a thermal relay.

For the element whose on-off changes with the change of temperature, the normal status is that the element is in the state of on. The abnormal status is that the element fails, i.e. the connection is cut off. For the element whose resistance value changes greatly with the change of temperature. If the element is in the state of standard resistance value, the element is at a normal status. If the resistance value is too high or too low, i.e. deviates quite far from the standard value, the element is in an abnormal state.

Though illustration and description of the present disclosure have been given with reference to preferred embodiments thereof, it should be appreciated by persons of ordinary skill in the art that various changes in forms and details can be made without deviation from the spirit and scope of this disclosure, which are defined by the appended claims.

What is claimed is:

1. A device for preventing internal combustion of equipment from spreading outwards, comprising a sampling circuit, a detecting and monitoring circuit connected to the sampling circuit and a low-voltage datum power supply; wherein
the output of the low-voltage datum power supply is connected to the ground via the sampling circuit to form a loop circuit;
the sampling circuit comprises at least two thermal detectors, the detecting and monitoring circuit comprises a first monitoring output end (out1) and a second monitoring output end (out2), the detecting and monitoring circuit monitors the output of the first monitoring output end (out1) and the second monitoring output end (out2) according to the working status of the thermal detectors as follows:
the first monitoring output (Vout1) is inactive and the second monitoring output (Vout2) is inactive when the at least two thermal detectors are in normal status;
the first monitoring output (Vout1) is inactive and the second monitoring output (Vout2) is active when some of the at least two thermal detectors are in abnormal status;
the first monitoring output (Vout1) is active and the second monitoring output (Vout2) is active when the at least two thermal detectors are all in abnormal status;
the first monitoring output (Vout1) is configured to turn off a power supply, and the second monitoring output (Vout2) is configured to drive an alarm unit without affecting the power supply.

2. The device according to claim 1, wherein the sampling circuit comprises a first thermal detector (F1), a second thermal detector (F2), a first resistor (R1), a second resistor (R2), a third resistor (R3) and a fourth resistor (R4); wherein
the first thermal detector (F1) and the first resistor (R1) are connected in series to form a first branch circuit, the second thermal detector (F2) and the fourth resistor (R4) are connected in series to form a second branch circuit, the first branch circuit and the second branch circuit are connected in parallel to form a thermal detector parallel circuit; the thermal detector parallel circuit is connected to the second resistor (R2) and the third resistor (R3) orderly in series between the low-voltage datum power supply and the ground.

3. The device according to claim 2, wherein the detecting and monitoring circuit comprises a first input end (in1) and a second input end (in2); wherein
the first input end (in1) of the detecting and monitoring circuit is connected between the thermal detector parallel circuit and the second resistor (R2); and
the second input end (in2) is connected between the second resistor (R2) and the third resistor (R3).

4. The device according to claim 3, wherein the detecting and monitoring circuit is realized by an integrated voltage comparator or a discrete voltage comparator.

5. The device according to claim 1, wherein the sampling circuit comprises a first thermal detector (F1), a second thermal detector (F2), a first resistor(R1), a fifth resistor (R2') and a fourth resistors (R4); wherein the first thermal detector (F1) and the first resistor (R1) are connected in series to form a first branch circuit; the second thermal detector (F2) and the fourth resistor (R4) are connected in series to form a second branch circuit; the first branch circuit and the second branch circuit are connected in parallel to form a thermal detector parallel circuit; and the thermal detector parallel circuit and the fifth resistor (R2') are connected in series between the low-voltage datum power supply and the ground.

6. The device according to claim 5, wherein the detecting and monitoring circuit comprises an analog-to-digital AD converting chip and a CPU coupled with the AD converting chip; wherein an input end (in1) of the AD converting chip is connected between the thermal detector parallel circuit of the sampling circuit and the fifth resistor (R2'); one output pin on the CPU is a first monitoring output end; another output pin on the CPU is a second monitoring output end.

7. The device according to claim 1, wherein the thermal detector in the sampling circuit is installed on a thermal detecting single-board and the thermal detecting single-board is installed in the device in a manner of hot plug.

8. The device according to claim 7, wherein the device further comprises a pull-up resistor configured to pull a mode selection signal in the detecting and monitoring circuit up to the status of a power supply VCC so as to make the first monitoring output (Vout1) inactive and the second monitoring output (Vout2) active when the thermal detecting single-board is off-duty.

9. The device according to claim 8, wherein the device further comprises a delay driving circuit connected behind the first monitoring output end in series and configured to eliminate the status of dithering occurred during swapping and plugging the thermal detecting single-board.

10. The device according to claim 1, wherein the thermal detector is an element whose on-off changes with the change of temperature, or an element whose resistance value changes greatly with the change of temperature.

11. The device according to claim 1, wherein the power supply comprises, but not limited to, a power supply of a fan or a power supply of a system and a fan.

12. A device for preventing internal combustion of equipment from spreading outwards, comprising at least two sampling circuits, a detecting and monitoring circuit and a low-voltage datum power supply which are connected to each of the sampling circuits respectively; wherein an output of the low-voltage datum power supply is connected to the ground via each of the sampling circuits respectively to form a loop circuit with each of the sampling circuits independently;

each of the sampling circuits comprises at least two thermal detectors;

the detecting and monitoring circuit comprises a first monitoring output end (out1) and a second monitoring output end (out2); and the detecting and monitoring circuit monitors the output of the first monitoring output end (out1) and the second monitoring output end (out2) according to the working status of the thermal detector in each of the sampling circuits as follows:

the first monitoring output (Vout1) is inactive and the second monitoring output (Vout2) is inactive when the thermal detectors in the device are all in normal status;

the first monitoring output (Vout1) is inactive and the second monitoring output (Vout2) is active when some of the thermal detectors in the device are in abnormal status and at least one thermal detector in each of the sampling circuits is normal;

the first monitoring output (Vout1) is active and the second monitoring output (Vout2) is active when all the thermal detectors in at least one sampling circuit are in abnormal status;

the first monitoring output (Vout1) is configured to cut off the power supply, and the second monitoring output (Vout2) is configured to drive an alarm unit without affecting the power supply.

13. The device according to claim 12, wherein the sampling circuit comprises a first thermal detector (F1), a second thermal detector (F2), a first resistor (R1), a fifth resistor (R2') and a fourth resistors (R4); wherein the first thermal detector (F1) and the first resistor (R1) are connected in series to form a first branch circuit, the second thermal detector (F2) and the fourth resistor (R4) are connected in series to form a second branch circuit, the first branch circuit and the second branch circuit are connected in parallel to form a thermal detector parallel circuit, and the thermal detector parallel circuit and the fifth resistor (R2') are connected in series between the low-voltage datum power supply and the ground.

14. The device according to claim 13, wherein the detecting and monitoring circuit comprises an analog-to-digital AD converting chip and a CPU coupled with the AD converting chip; wherein each input end (in1) of the AD converting chip is connected between the thermal detector parallel circuit of each of the sampling circuits and the fifth resistor (R2') respectively, one output pin on the CPU being a first monitoring output end, another output pin on the CPU being a second monitoring output end.

15. The device according to claim 13, wherein the thermal detector parallel circuit is installed on a thermal detecting single-board, the thermal detecting single-board is installed in the device in a manner of hot plug.

16. The device according to claim 15, wherein the device further comprises a pull-up resistor configured to pull a mode selection signal in the detecting and monitoring circuit up to the status of a power supply VCC so as to make the first monitoring output (Vout1) inactive and the second monitoring output (Vout2) active when the thermal detecting single-board is off-duty.

17. The device according to claim 16, wherein the device further comprises a delay driving circuit connected behind the first monitoring output end in series and configured to eliminate the status of dithering occurred during swapping and plugging the thermal detecting single-board.

18. The device according to claim 12, wherein the thermal detector is an element whose on-off changes with the change of temperature, or an element whose resistance value changes greatly with the change of temperature.

19. The device according to claim 12, wherein the power supply comprises, but not limited to, a power supply of a fan or a power supply of a system and a fan.

* * * * *

UNITED STATES PATENT AND TRADEMARK OFFICE
CERTIFICATE OF CORRECTION

PATENT NO.        : 7,551,418 B2                                       Page 1 of 1
APPLICATION NO.   : 12/052560
DATED             : June 23, 2009
INVENTOR(S)       : Ran et al.

It is certified that error appears in the above-identified patent and that said Letters Patent is hereby corrected as shown below:

On the Title Page, Item (30) Foreign Application Priority Data, Chinese Patent Application No. "2005 1 0037533" should read --200510037533.8--

Signed and Sealed this

Twenty-fifth Day of August, 2009

David J. Kappos
*Director of the United States Patent and Trademark Office*